United States Patent
Pallerla et al.

(10) Patent No.: US 11,854,609 B2
(45) Date of Patent: Dec. 26, 2023

(54) MEMORY WITH REDUCED CAPACITANCE AT A SENSE AMPLIFIER

(71) Applicant: QUALCOMM Incorporated, San Diego, CA (US)

(72) Inventors: Arun Babu Pallerla, San Diego, CA (US); Anil Chowdary Kota, San Diego, CA (US); Hochul Lee, Los Angeles, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 120 days.

(21) Appl. No.: 17/446,195

(22) Filed: Aug. 27, 2021

(65) Prior Publication Data

US 2023/0066241 A1    Mar. 2, 2023

(51) Int. Cl.
*G11C 11/419*    (2006.01)
(52) U.S. Cl.
CPC ................... *G11C 11/419* (2013.01)
(58) Field of Classification Search
CPC ............... G11C 11/418; G11C 11/419
USPC ........................................... 365/154
See application file for complete search history.

(56) References Cited

U.S. PATENT DOCUMENTS

| | | | |
|---|---|---|---|
| 5,594,704 A * | 1/1997 | Konishi | G11C 7/1006 365/230.03 |
| 5,898,611 A | 4/1999 | Yamada | |
| 5,991,216 A * | 11/1999 | Raad | G11C 11/4074 365/205 |
| 6,327,214 B1 * | 12/2001 | Yoon | G11C 8/12 365/205 |
| 6,738,279 B1 * | 5/2004 | Kablanian | G11C 5/025 365/72 |
| 9,779,798 B1 * | 10/2017 | Li | G11C 11/4087 |
| 10,923,185 B2 | 2/2021 | Jung et al. | |
| 2004/0179418 A1 * | 9/2004 | Hwang | G11C 7/1006 365/230.03 |
| 2005/0141325 A1 * | 6/2005 | Winograd | G06F 13/4086 365/230.03 |
| 2006/0083097 A1 * | 4/2006 | Frulio | G11C 5/025 365/230.03 |
| 2019/0267049 A1 * | 8/2019 | Asthana | G11C 16/04 |
| 2021/0110851 A1 * | 4/2021 | Gupta | G11C 11/419 |
| 2021/0110867 A1 * | 4/2021 | Gupta | G11C 8/10 |
| 2021/0158855 A1 * | 5/2021 | Banerjee | G11C 7/1087 |
| 2021/0304816 A1 * | 9/2021 | Gupta | G11C 11/418 |

OTHER PUBLICATIONS

International Search Report and Written Opinion—PCT/US2022/038534—ISA/EPO—dated Oct. 25, 2022.
Susan T., "IEEE 100, The Authoritative Dictionary of IEEE Standards Terms Seventh Edition", Dec. 11, 2000, 3 Pages, XP055967464, p. 896.

* cited by examiner

*Primary Examiner* — Sung Il Cho
(74) *Attorney, Agent, or Firm* — Haynes and Boone, LLP (57) ABSTRACT

A memory is provided that includes multiple memory banks, each one of the memory banks being associated with a read multiplexer. A first read multiplexer couples a first plurality of bit lines to a first sense node pair, and a second read multiplexer couples a second plurality of bit lines to a second sense node pair. A first sense amplifier is coupled to the first sense node pair. The second sense node pair may be coupled to the same sense amplifier or a different sense amplifier.

13 Claims, 9 Drawing Sheets

FIG. 9

MEMORY WITH REDUCED CAPACITANCE AT A SENSE AMPLIFIER

TECHNICAL FIELD

This application relates to memories, and more particularly to multi-bank memories with reduced capacitance at a sense amplifier.

BACKGROUND

In a conventional static random-access memory (SRAM), a bitcell connects to a pair of bit lines during a read operation. Prior to the read operation, the bit lines are pre-charged to the power supply voltage used for the bitcell. Depending upon the binary content of the bitcell, the bitcell will slightly discharge either the true bit line or the complement bit line in the bit line pair from its pre-charged state. For example, suppose that the bitcell is storing a binary one. During a read operation, a word line is asserted so that the bitcell is coupled to its bit line pair. Due to the binary one value, the complement bit line will then be discharged from its pre-charged state. But the bitcell will maintain the true bit line at its pre-charged state.

The read operation will thus develop a voltage difference across the bit line pair. This bit line voltage difference is not full rail but instead equals a fraction of the power supply voltage. To respond to this relatively small voltage difference and make a bit decision as to what was stored in the bitcell, a sense amplifier may use a relatively large amount of gain.

A charge transfer sense amplifier (CTSA) may provide a relatively large amount of gain to allow for a bit decision with a relatively small voltage difference. A CTSA may provide the gain in part by transferring charge between a bit line or complement bit line) and a sense node (or complement sense node). However, a number of bit lines may share a sense node, and the higher the number of bit lines per sense node, the higher the parasitic capacitance may be, where parasitic capacitance may be an obstacle to quick and reliable bit decisions.

Accordingly, there is a need in the art for memories having reduced parasitic capacitance.

SUMMARY

In one implementation, a circuit includes a first read multiplexer coupling a first plurality of bit lines to a first sense node and a first complementary sense node; a second read multiplexer coupling a second plurality of bit lines to a second sense node and a second complementary sense node; and a first sense amplifier coupled to the first sense node and the first complementary sense node, wherein the first read multiplexer is associated with a first bank of memory bit cells, and wherein the second read multiplexer is associated with a second bank of memory bit cells.

In another implementation, a method includes in a first read operation, multiplexing a first plurality of bit line pairs with a first sense node pair, including coupling a first bit line pair of the first plurality of bit line pairs with the first sense node pair; charge sharing between the first bit line pair and the first sense node pair; inputting values from the first sense node pair to logic circuitry; causing the logic circuitry to make a bit decision based on the values from the first sense node pair; and in a subsequent read operation, multiplexing a second plurality of bit line pairs with a second sense node pair, including coupling a second bit line pair of the second plurality of bit line pairs to the second sense node pair, wherein the first plurality of bit line pairs is associated with a first bank of memory bit cells, and wherein the second plurality of bit line pairs is associated with a second bank of memory bit cells.

In another implementation, a memory device includes a plurality of memory banks, each one of the memory banks including a plurality of bit line pairs; a plurality of sense node pairs, each of the sense node pairs associated with a respective one of the memory banks; means for multiplexing the bit line pairs with the sense node pairs; and means for making bit decisions based on voltages associated with the sense node pairs during a plurality of read operations directed to the plurality of memory banks.

In yet another implementation, a memory includes a first memory bank including a first plurality of bit cells arranged in a first plurality of columns; a second memory bank including a second plurality of bit cells arranged in a second plurality of columns; a first sense node pair coupled to the first plurality of columns by a first read multiplexer; a second sense node pair coupled to the second plurality of columns by a second read multiplexer; and a first sense amplifier coupled to the first sense node pair.

These and additional advantages may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

A memory such as an SRAM is provided in which there are multiple memory banks, each of the memory banks associated with a read multiplexer. For instance, a first read multiplexer may couple a first plurality of bit lines to a first sense node and a first complementary sense node. A second read multiplexer may couple a second plurality of bit lines to a second sense node and a second complementary sense node. A plurality of bit lines may include a plurality of bit line pairs (a bit line and a bit line complement). Each bit line pair may correspond to a column of bit cells. Thus, each memory bank may include multiple bit cell columns traversed by multiple word lines.

In contrast to other examples in which multiple read multiplexers may couple to a same sense node pair (a sense node and a sense node complement), implementations discussed herein may include an architecture in which the first read multiplexer couples to the first sense node and the first complementary sense node and the second read multiplexer couples to the second sense node and the second complementary sense node. As noted above, as a number of bit lines sharing a sense node and complementary sense node increases, so does a parasitic capacitance. However, the implementations discussed herein increase a number of sense node pairs by providing at least one pair to each of the memory banks. Thus, a ratio of bit lines to sense nodes is reduced, thereby reducing a parasitic capacitance seen by each sense amplifier. The lower parasitic capacitance may increase a voltage achieved by charge sharing, thereby providing faster and more reliable bit decisions.

In one example, there is a first sense amplifier coupled to the first sense node and first complementary sense node and a second sense amplifier coupled to the second sense node and second complementary sense node. In other words, each memory bank is associated with its own sense amplifier. The sense amplifiers may be implemented in any appropriate way, including each of the sense amplifiers being built as a cross coupled pair of NAND gates, each of the cross coupled pairs being coupled to a push pull circuit.

In another implementation, multiple memory banks are coupled with a single sense amplifier. In other words, the sense amplifier is coupled to both sense node pairs and, thus, to each of the multiplexers. The sense amplifier may include a cross coupled pair of AND-OR-invert (AOI) gates, where a first AOI gate is coupled to the first complementary sense node, the second complementary sense node, and an output from a second AOI gate, and where the second AOI gate is coupled to the first sense node, the second sense node, and an output of the first AOI gate. The cross coupled pair of AOI gates may share a push pull circuit.

An advantage of the implementation using the cross coupled AOI gates is that a number of transistors may be reduced when compared to an implementation using two cross coupled pairs of NAND gates. Reducing a number of transistors may reduce an amount of silicon area used on a chip, perhaps reducing a cost of manufacture as well as potentially saving dynamic power and leakage power.

The sense amplifiers may be implemented as charge sharing sense amplifiers (CTSAs). In one example, each bit line for the group of multiplexed columns couples to the sense nodes through its own charge-transfer transistor. A source of each charge-transfer transistor couples to its bit line whereas a drain of each charge-transfer transistor couples to its sense node. The gate-to-source voltage for each charge-transfer transistor is thus determined by its gate voltage and its bit line voltage. The following discussion will assume that each charge-transfer transistor is a p-type metal-oxide semiconductor (PMOS) transistor but it will be appreciated that charge transfer may also be accomplished with n-type metal-oxide semiconductor (NMOS) transistors.

Prior to a word line assertion for a read operation, the bit lines are pre-charged to a power supply voltage whereas the sense nodes are discharged. The word line is then asserted for a word line assertion period during which a bit line voltage difference develops for each bit line pair that depends upon the bit stored in each bitcell at the intersections of the word line and the bit line pairs for the group of multiplexed columns. Depending upon this bit, either a true bit line or a complement bit line in each bit line pair is discharged slightly from the pre-charged state (the power supply voltage, VDD). The charge transfer occurs during a charge-transfer period that begins near an end of the word line assertion period. Prior to the charge-transfer period, the gate voltage for each charge-transfer transistor is maintained at the power supply voltage so that each charge-transfer transistor is off. The charge-transfer period is delayed with respect to the assertion of the word line so that the bit line voltage difference may develop for each bit line pair. During the charge-transfer period, the gate voltage for the charge-transfer transistors is dropped from the power supply voltage at some slew rate towards ground. For example, a relatively small inverter or the dummy bit line voltage may be used to control the gate voltage for the charge-transfer transistors. Depending upon the bit value, either the true bit line or the complement bit line in each bit line pair will drop slightly from its pre-charged state (the power supply voltage). This bit line is referred to in the following discussion as the partially-charged bit line. But the remaining bit line in each bit line pair will remain charged to the power supply voltage. This bit line is referred to as the fully-charged bit line in the following discussion.

The gate voltage for each charge-transfer transistor in the group of multiplexed columns is dropped during the charge-transfer period so that the gate-to-source voltage (the gate-to-bit-line voltage) for the charge-transfer transistor for the fully-charged bit line satisfies its threshold voltage. But the reduction in voltage for the partially-charged bit line is such that this same gate voltage does not satisfy the threshold voltage for the charge-transfer transistor for the partially-charged bit line. Thus, only the charge-transfer transistor for the fully-charged bit line in a bit line pair will initially conduct charge to its sense node. The capacitance of the sense node is relatively small compared to the capacitance of the bit line so the resulting charge transfer causes the sense node to be nearly charged to the power supply voltage. In contrast, the sense node for the partially-discharged bit line remains in its discharged default state such that the voltage difference between the sense nodes for an accessed bit line pair is nearly full rail (a voltage difference nearly equaling the power supply voltage). The charge transfer has thus resulted in an amplification of the relatively small bit line voltage difference into a nearly-full-rail voltage difference on the sense nodes. The sensing by the sense amplifier occurs in a sense enable period.

Figure 1:
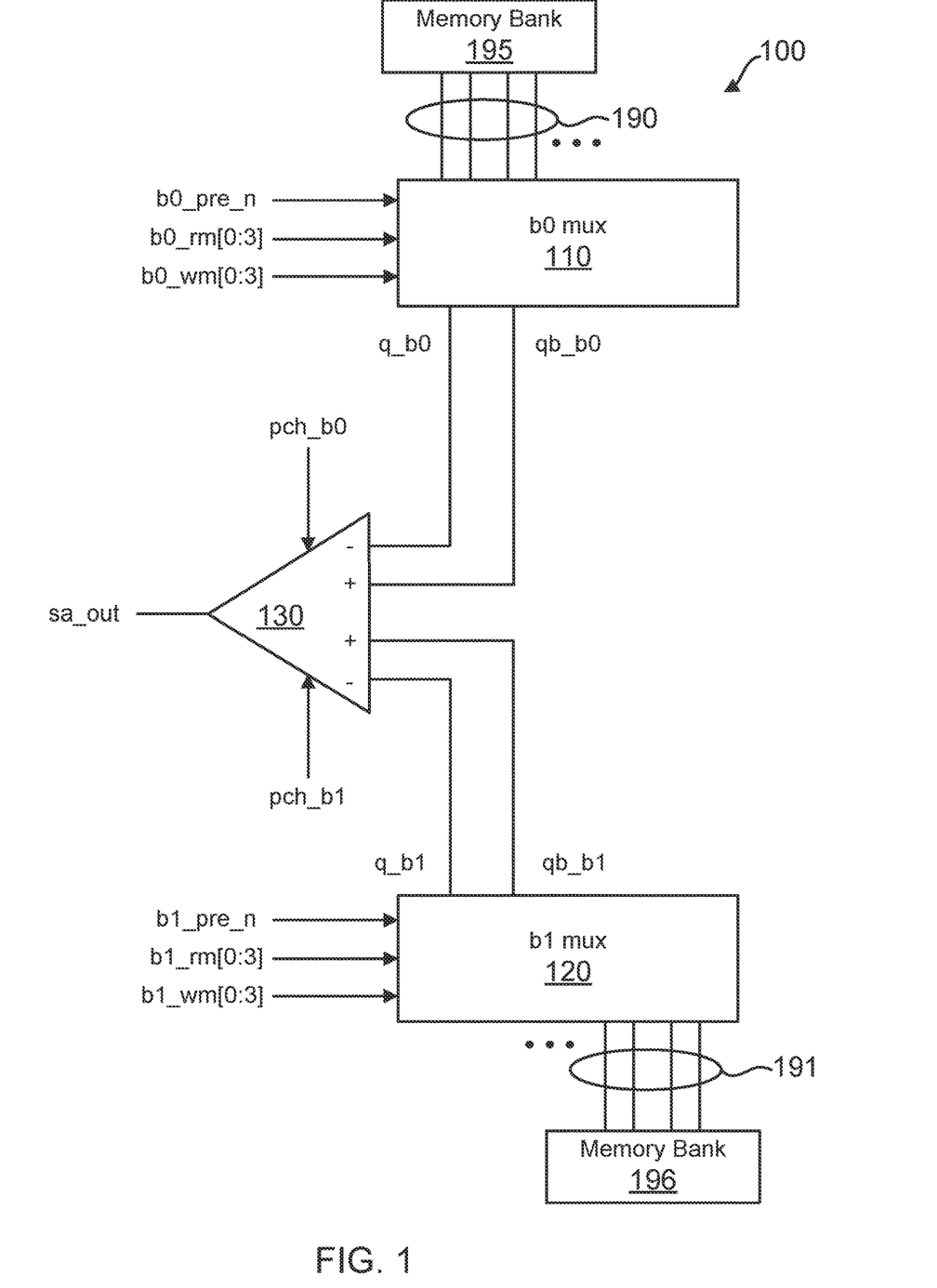
FIG. 1 illustrates a multi-bank memory with multiple sense node pairs in accordance with an aspect of the disclosure.

FIG. 1 is an illustration of memory system 100, according to one implementation. Memory system 100 is a multi-bank memory system, in this case using two memory banks, namely, bank b0 195, and bank b1 196. Each of the memory banks 195, 196 includes multiple columns of bit cells, each column having a bit line and complementary bit line, and each of the memory banks traversed by multiple word lines. Bit lines and complementary bit lines 190, 191 are illustrated as each having two pairs, and it is understood that a given memory bank may include any appropriate number of bit line pairs corresponding to any appropriate number of columns.

Looking at multiplexer 110, it corresponds to bank b0 195, and it multiplexes the bit line pairs 190 onto the sense nodes q_b0 and qb_b0. Similarly, multiplexer 120 corresponds to bank b1 196, and it multiplexes the bit line pairs 191 onto the sense nodes q_b1, qb_b1. In this example, each of the multiplexers 110, 120 receives three signals, including pre_n (bit line pre-charging), rm [0:3] (a read multiplexing signal), and wm [0:3] (a write multiplexing signal). It is noted here that the signals rm and wm are shown as selecting among four columns, and as noted above, the scope of implementations supports any number of columns that may be multiplexed.

The sense nodes (q_b0, q_b1) and complementary sense nodes (qb_b0, qb_b1) are inputs to the sense amplifier 130. Further in this example, memory system 100 performs either a read or a write operation on one of the memory banks 195, 196 at a given time and does not perform operations simultaneously on both memory banks 195, 196. Sense amplifier 130 bases a bit decision upon a difference in voltage between a given sense node pair corresponding to one of the memory banks 195, 196 in response to a read operation on that respective bank.

Figure 7:
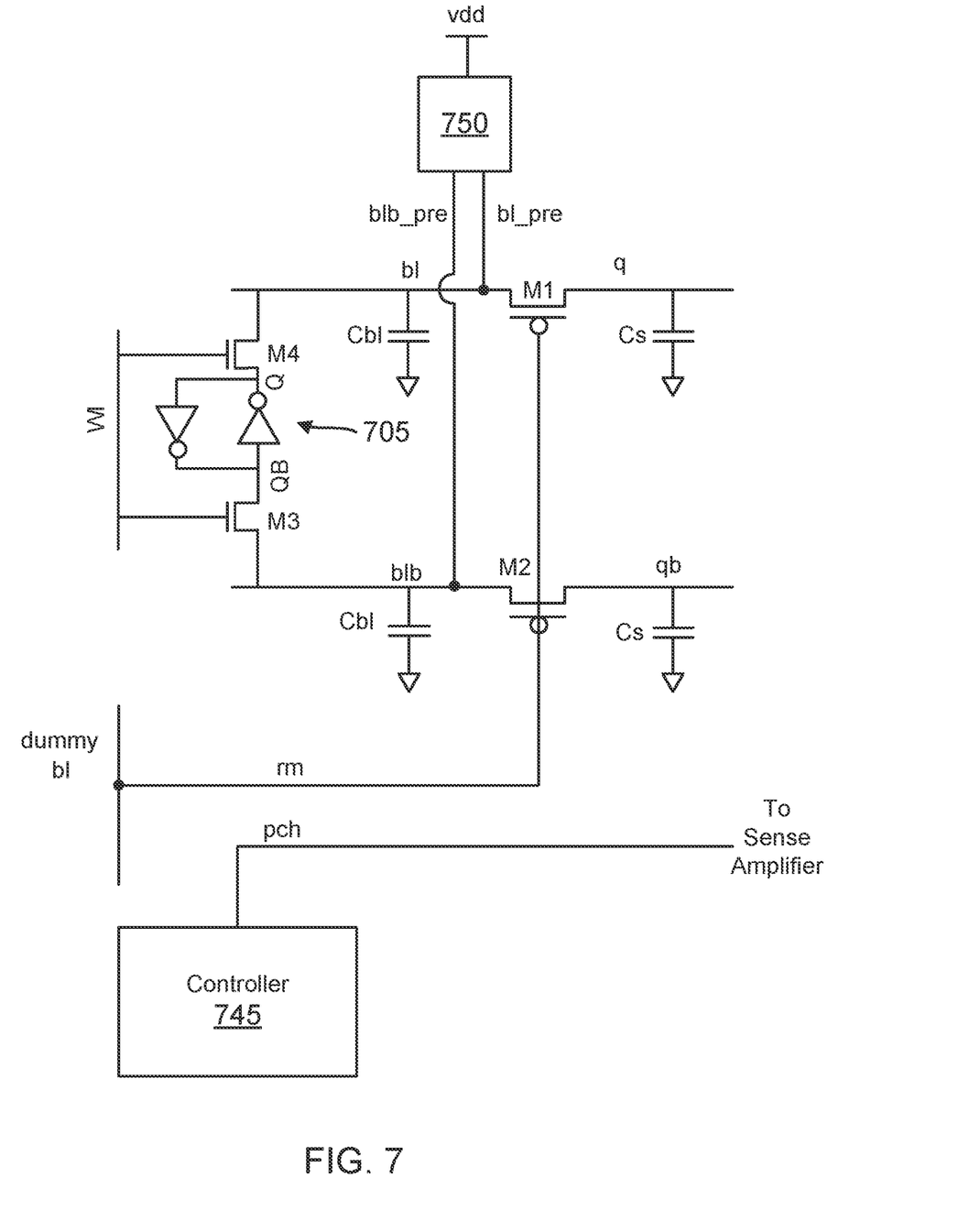
FIG. 7 illustrates an example interface between a bit line pair and a sense node pair in accordance with an aspect of the disclosure.

The interfaces between bit line pairs and sense node pairs are described in more detail with respect to FIG. 7. Furthermore, an example architecture for sense amplifier 130 is described in more detail with respect to FIGS. 2, 4.

FIG. 7 is an illustration of an example interface of a single bit line and bit line pair (bl and blb) with a sense node and complementary sense node (q and qb). FIG. 7 is genericized for ease of explanation, and it is understood that the concepts described in FIG. 7 are applicable to both the sense amplifier architectures of FIGS. 1-4 as well as FIGS. 5-6. FIG. 7 illustrates only a single bit line pair, and it is understood that other bit line pairs may be coupled to the sense node q and qb and selected using an appropriate multiplexer signal rm [0:3].

The bit line pair of the bit line bl and a complement bit line blb form a column. A bitcell 705 lies at an intersection of the column and a word line wl. In this example, bitcell 705 is formed by a pair of cross-coupled inverters. The output node of a first one of the inverters is the true (Q) output for bitcell 705. This output node couples to the bit line bl through an NMOS access transistor M4. Similarly, the output node of a remaining second one of the inverters is the complement (QB) output for bitcell 705 that couples to the complement bit line blb through an NMOS access transistor M3. The word line wl couples to the gates of the access transistors so that the Q and QB nodes drive their respective bit lines during a word line assertion period.

In an example read operation, a clock cycle triggers an assertion of the voltage for word line wl. Prior to this word line assertion, bit lines bl and blb were pre-charged to the power supply voltage by a bit line pre-charge circuit 750. Bit line bl couples to a corresponding sense node q through a PMOS charge-transfer transistor M1. Similarly, complement bit line blb couples to a corresponding sense node qb through a PMOS charge-transfer transistor M2. Prior to the word line assertion, a gate voltage rm for the charge-transfer transistors M1, M2 is asserted to the power supply voltage to prevent charge transfer to the sense nodes. Controller 745 asserts a sense node pre-charge signal (pch) prior to the word line assertion. The asserted sense node pre-charge signal drives the gates of NMOS transistors (e.g., N1, N2 in FIG. 4). The sources of those NMOS transistors are tied to ground whereas their drains are tied to q and qb, respectively. The assertion of the sense node pre-charge signal will thus discharge both q and qb. The same is true, e.g., for transistors N3, N4, which discharge q and qb for the other memory bank.

The voltage for the word line wl may then be asserted, which switches on access transistors M3 and M4 so that the true and complement output nodes of bitcell 705 are connected to bit line bl and blb, respectively. The word line assertion causes a bit line voltage difference to develop between the bit lines in each bit line pair. One bit line in each bit line pair will be reduced slightly from the power supply voltage (the partially-discharged bit line) whereas a remaining bit line in each bit line pair will stay at its pre-charged state (the fully-charged bit line).

With the word line still asserted and the bit line voltage difference developed, the charge transfer period is triggered by discharging gate voltage rm. For example, the gate voltage rm may be controlled by a dummy bit line. Due to this less-than-instantaneous discharge of the gate voltage rm, the gate voltage rm will discharge to the threshold voltage for the charge-transfer transistor (e.g., M2) having its source tied to the fully-charged bit line but will still be above the threshold voltage for the charge-transfer transistor (e.g., M1) having its source tied to the partially-discharged bit line. The charge-transfer transistor for the fully-charged bit line will thus conduct charge to its sense node prior to when the charge-transfer transistor conducts charge from the partially-discharged bit line. The sense node voltage qb will thus increase prior to the increase of the complement sense node voltage q.

Figure 2:
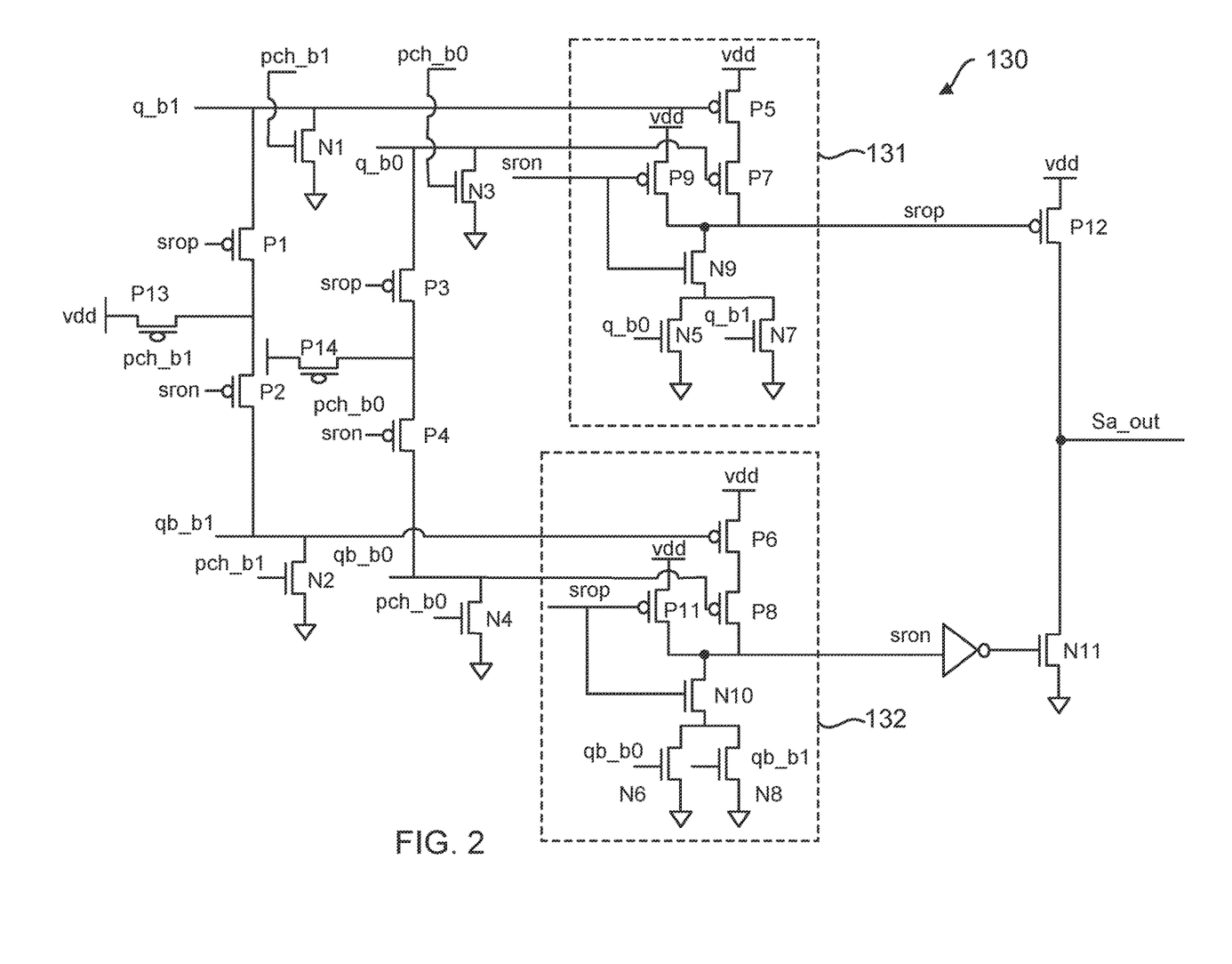
FIG. 2 illustrates an example sense amplifier in the memory of FIG. 1.

The architectures illustrated in both FIGS. 1-4 and 5-6 use this voltage difference to make a bit decision. For instance, FIG. 2 is an illustration of example sense amplifier 130, of the FIG. 1 implementation. Sense amplifier 130 in this example is implemented using a cross coupled pair of AOI gates 131, 132. The truth table for AOI gate 131 is shown below:

| Input | | Output | |
|---|---|---|---|
| q_b0 | q_b1 | SRON | SROP |
| 0 | 0 | 0 | 1 |
| 0 | 0 | 1 | 1 |
| 0 | 1 | 0 | 1 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

The truth table for AOI gate 132 is shown below:

| Input | | Output | |
|---|---|---|---|
| qb_b0 | qb_b1 | SROP | SRON |
| 0 | 0 | 0 | 1 |
| 0 | 0 | 1 | 1 |
| 0 | 1 | 0 | 1 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

Figure 3:
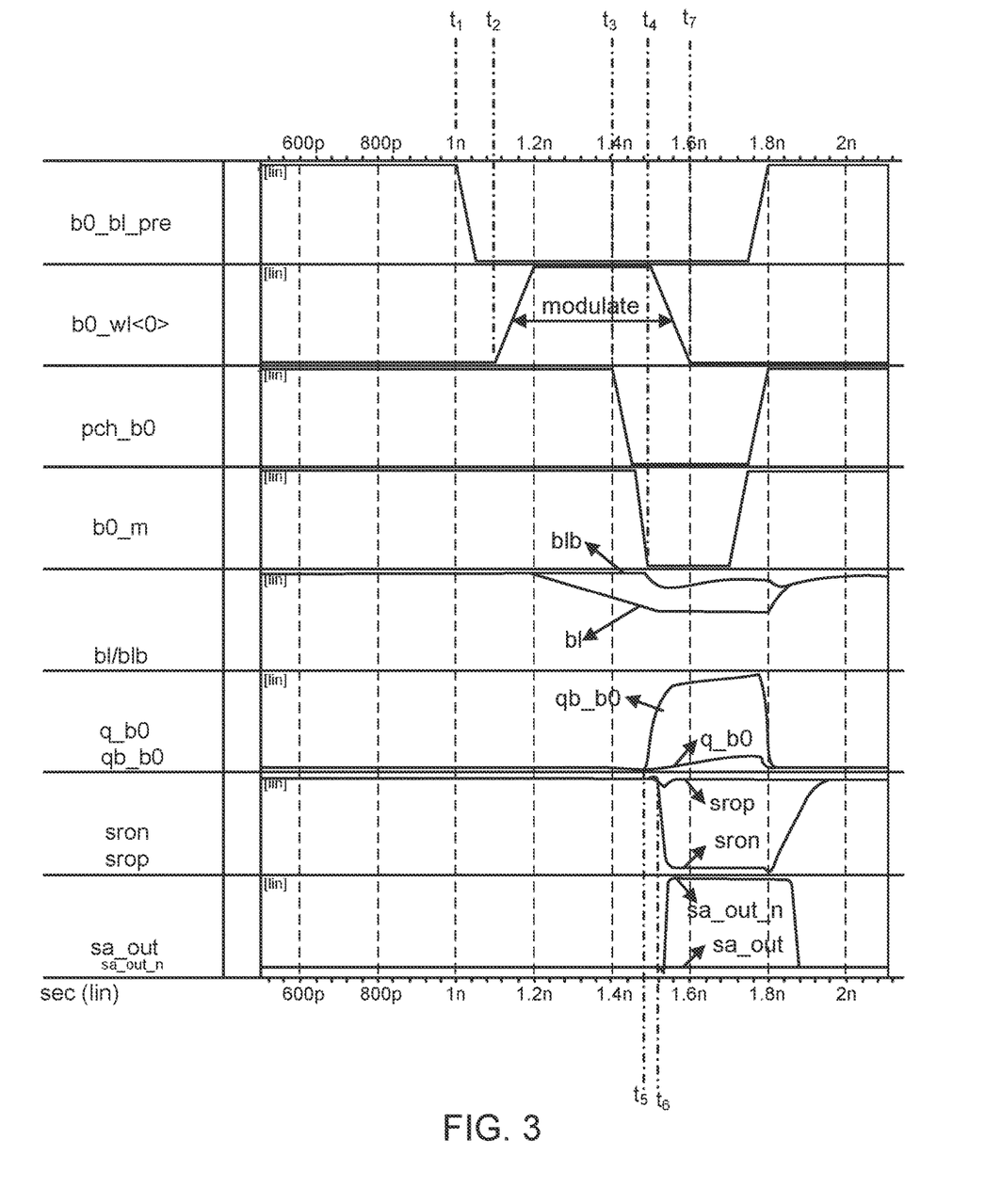
FIG. 3 illustrates a timing diagram of the example sense amplifier of FIG. 1.

FIG. 3 provides an example timing diagram of the signals applied to the sense amplifier 130 of FIG. 2, according to one implementation. This example continues from the discussion of FIG. 7 (above) in which bl and blb correspond to a bit line pair in bank 195 and start off at VDD, and bl is eventually discharged to read a stored zero.

The topmost signal (b0_bl_pre) is a pre-charge signal, as discussed above with respect to FIG. 7. The pre-charge is turned off at time t1, then the word line wl signal is asserted at time t2. Bit line (bl) is discharged, but bit line complement (blb) remains at VDD.

Once bl and blb have a sufficient voltage difference, then pch_b0 is de-asserted at time t3, which means that the discharge NMOS transistors N3, N4 turn off, while transistors N1, N2 remain on. Transistor P14 is turned on, but signals SROP, SRON are both high, which turns off transistors P1-P4, as well as N11 and P12. Transistors P1 and P3 couple VDD to q_b0 and q_b1, and transistors P2 and P4 couple VDD to qb_b0 and qb_b1.

Then, the read mux signal (b0_rm) turns on at time t4, which couples the sense node pairs to the bit line pairs. Bit line bl is coupled to sense node q, and blb is coupled to complementary sense node qb. Bit line complement blb has a higher potential, which causes qb to go up more quickly at time t5, compared to q. (Note that q_b1 and qb_b1 remain at a low value so that transistors P5, P6, are on, and transistors N7, N8 are off.) This results in the SRON signal going low at time t6. When SRON goes low, it turns on transistors P9, P2, P4, and N11 and turns off transistor N9. Meanwhile, transistors P1, P3, P11 are turned off, and N10 is turned on by SROP's high value. Transistor N11 pulls the output (sa_out) to zero (i.e., ground) while transistor P12 is off, and the output complement (sa_out_n) is therefore one. The word line wl is de-asserted at time t7, and pch and rm are de-asserted following that. The result is that the sense amplifier 130 senses an output value of zero, which it may send to output circuitry, such as an output latch (not shown).

By contrast, a read operation of a digital one value would cause bl to remain high and blb to discharge, thereby resulting in q_b0 being high and qb_b0 being low to output sa_out as a digital one. Of course, this example is for a read operation performed on memory bank 195. It is understood that a read operation performed on memory bank 196 would be performed similarly.

Figure 4:
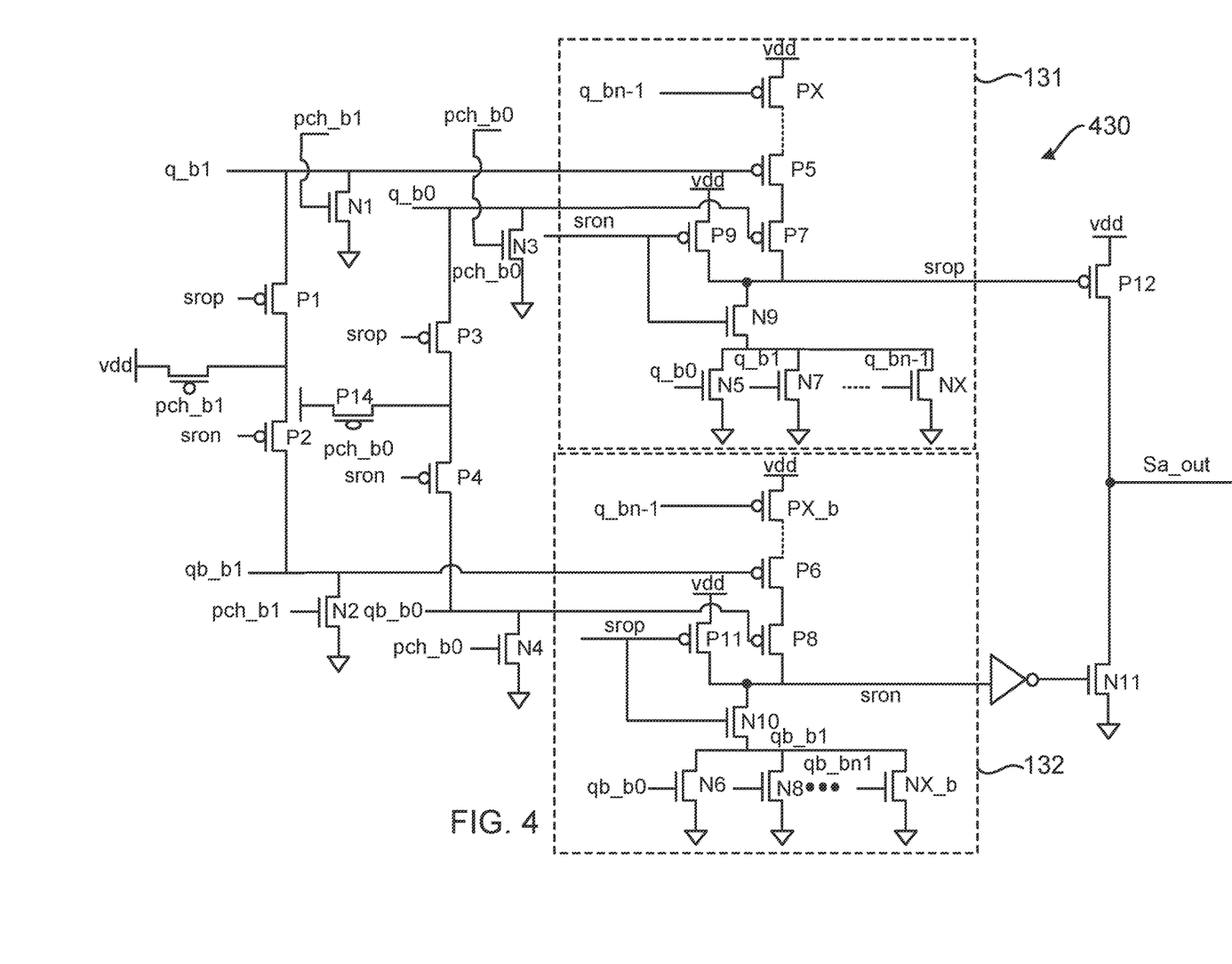
FIG. 4 illustrates an example sense amplifier in the memory of FIG. 1.

FIG. 4 is an illustration of example sense amplifier 430, according to one implementation. The example of FIG. 4 is offered to demonstrate that the scope of implementations is not limited to any particular number of memory banks. Rather, sense amplifier 430 may be scaled to accommodate a further number of memory banks up to N memory banks, where N is an integer greater than 2, and each memory bank would have a sense node and a complementary sense node (i.e., q_b0 to q_bn-1 and qb_b0 to qb_bn-1). Sense amplifier 430 may be scaled by increasing a number of series PMOS transistors PX and PX_b and a number of parallel NMOS transistors NX and NX_b.

Figure 5:
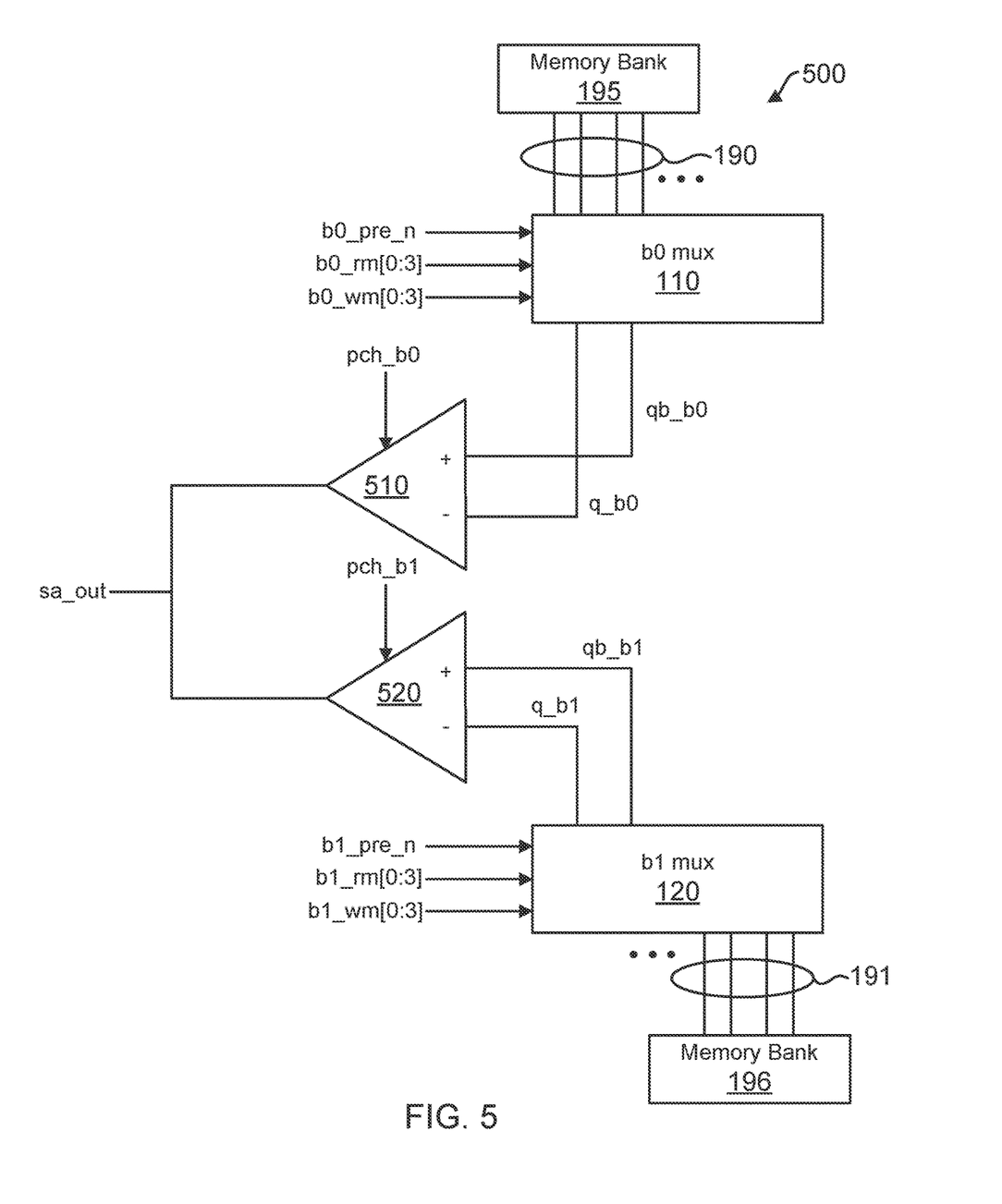
FIG. 5 illustrates a multi-bank memory with multiple sense node pairs in accordance with an aspect of the disclosure.

FIG. 5 illustrates an example memory system 500, according to one implementation. The implementation of FIG. 5 uses two sense amplifiers 510, 520 to accommodate multiple memory banks 195, 196. The sense amplifiers 510 and 520 may be implemented in a way similar to each other. In this implementation, memory bank 195 corresponds to sense node pair q_b0, qb_b0, and memory bank 196 corresponds to sense node pair q_b1, qb_b1. Sense amplifier 510 is coupled to multiplexer 110 by sense node pair q_b0, qb_b0, and sense amplifier 520 is coupled to multiplexer 120 by sense node pair q_b1, qb_b1.

In this example, only one of the memory banks 195, 196 would be written to or read from at a particular time. In other words, only one of sense amplifiers 510, 520 would be expected to make a bit decision during any particular read operation. Furthermore, the sense amplifiers 510, 520 would not be used during a write operation. Once a bit decision is made, the bit may be applied to a downstream circuit, such as a latch (not shown).

Figure 6:
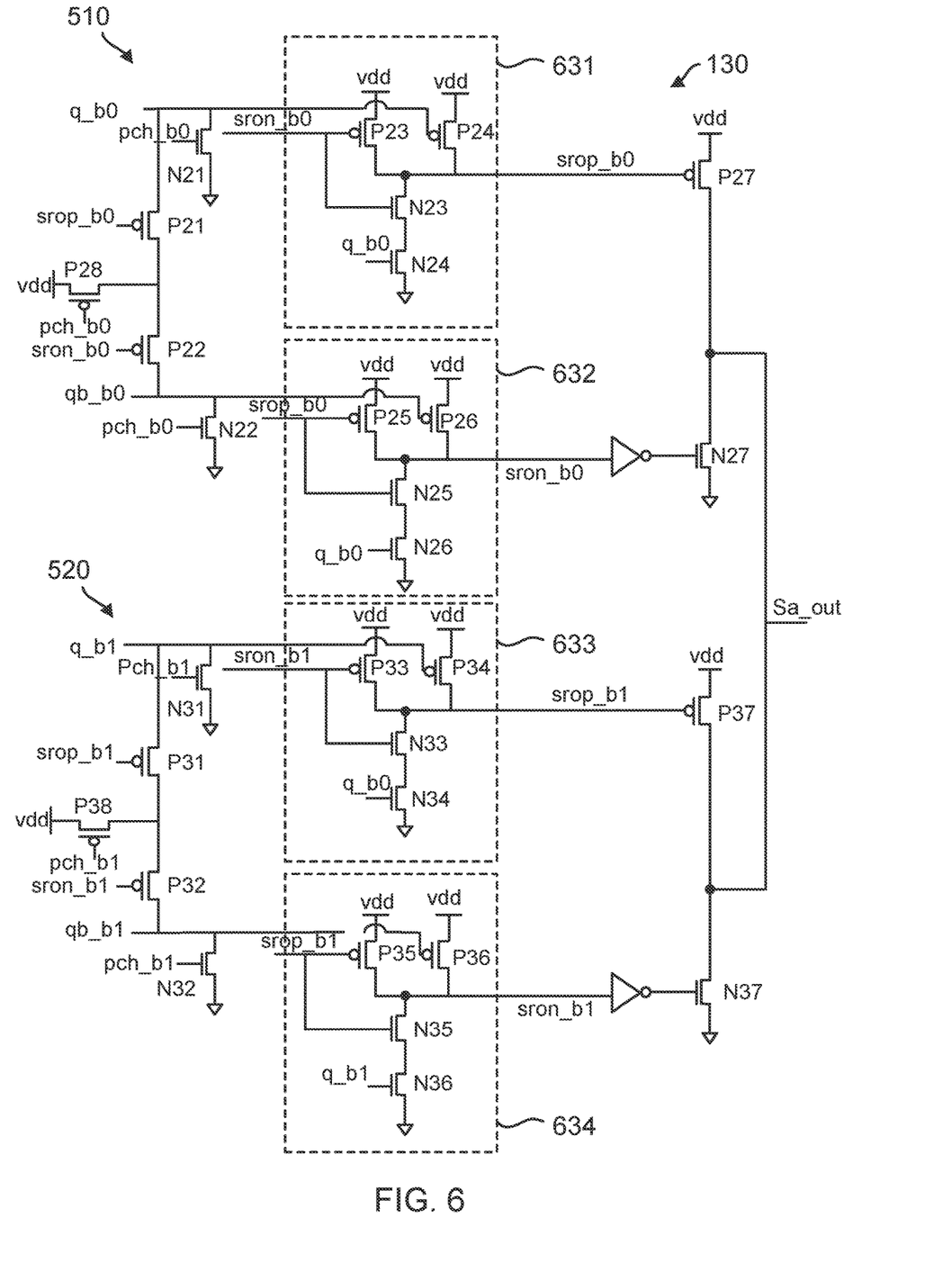
FIG. 6 illustrates an example sense amplifier in the memory of FIG. 5.

FIG. 6 is an illustration of the sense amplifiers 510, 520, according to one implementation. Specifically, sense amplifier 510 may include a cross coupled pair of NAND gates 631, 632, and sense amplifier 520 may include a cross coupled pair of NAND gates 633, 634. Each cross coupled pair of NAND gates makes a bit decision based on a voltage difference between the sense nodes in a sense node pair, just as in the example of FIGS. 1-4.

This example continues from the discussion of FIG. 7 (above) in which bl and blb correspond to a bit line pair in bank 195 and start off at the power supply voltage VDD, and bl is eventually discharged to read a stored zero. The table below is a truth table for the cross coupled NAND gates 631, 632, and it is understood that the same logic is provided by the cross coupled NAND gates 633, 634.

| q_b0 | qb_b0 | SROP_b0 | SRON_b0 | State |
|---|---|---|---|---|
| 1 | 0 | 1 | 0 | SROP_b0 is set to 1 |
| 1 | 1 | 1 | 0 | No change |
| 0 | 1 | 0 | 1 | SRON_b0 is set to 1 |
| 1 | 1 | 0 | 1 | No change |
| 0 | 0 | 1 | 1 | Standby |

Sense node q_b is connected to an input of NAND gate 631, and sense node qb_b0 ties to an input of NAND gate 632. NAND gates 631 and 632 are cross coupled to form an RS latch. In this example, the sense node pair is pre-charged to zero volts to cause both outputs of NAND gates 631 and 632 to be asserted high to the power supply voltage VDD, and the bitcell 705 stores a digital one. Pre-charging the sense node pair to zero volts turns on transistors P24, P26. Both SRON_b0 and SROP_b0 are high, which turns off transistors P21, P22, P23, P25, P27, and N27 and turns on transistors N23, N25. The parasitic capacitance of the sense nodes as conceptually represented by capacitors Cs (FIG. 7) is relatively small as compared to the bit line capacitance as conceptually represented by capacitors Cbl (FIG. 7). The brief amount of time in which charge-transfer transistor M1 (FIG. 7) begins conducting before charge-transfer transistor M2 (FIG. 7) thus causes a significant increase in the voltage of sense node q_b0 as compared to sense node qb_b0. This increase in voltage exceeds the threshold voltage for NAND gate 631 such that its output is discharged to zero. In other words, the increase in voltage of sense node q_b0 turns on transistors N24, N26, which pulls SROP_b0 to a zero value. The zero output of NAND gate 631 reinforces the binary high output of NAND gate 632 by turning on transistor P26 and turning off transistor N25. Transistor P27 is turned on, and transistor N27 remains off so that the binary one value stored in bitcell 705 is detected.

In an example in which a zero is stored in bit cell 705, the value output by NAND gate 632 would be zero by virtue of turning on transistors N25, N26, and the value output by NAND gate 631 would be one. The same process may be performed in the sense amplifier 520 in a different read operation. In other words, the arrangement of transistors in sense amplifier 520 results in the same logic provided by the arrangement of transistors in sense amplifier 510 by virtue of cross coupled NAND gates 633, 634.

Another difference between the implementations of FIGS. 1-4 and FIGS. 5-6 is that the implementation of FIGS. 5-6 includes two push pull circuits that include transistors P27, N27, P37, N37, whereas the implementation of FIGS. 1-4 includes a single push pull circuit including transistors P12 and N11. This is one instance in which the implementation of FIGS. 1-4 reduces a number of transistors versus the implementation of FIGS. 5-6. Also, as mentioned above, a single set of cross coupled AOI gates has a fewer number of transistors than two sets of cross coupled NAND gates, which is another instance in which the implementation of FIGS. 1-4 reduces the number of transistors. Nevertheless, both implementations described herein provide reliable operation and may be implemented in a given application as appropriate. As noted above, the implementations herein may reduce a number of bit line pairs per sense node pairs, thereby reducing parasitic capacitance seen by the sense amplifiers and, thus, making it possible to detect smaller voltage differences more quickly.

An example method for read operation will now be discussed with reference to the flowchart shown in FIG. 8. The method 800 may be performed by a memory, such as those illustrated in FIGS. 1 and 5. In other words, the method 800 may be performed by a multi-bank memory system having multiple read multiplexers and one or more sense amplifiers to make a bit decision for a given read operation.

At action 810, the method includes multiplexing a first plurality of bit line pairs with a first sense node pair. Action 810 may include coupling a first bit line pair of the plurality of bit line pairs with the first sense node pair. An example is described above with respect to FIG. 7, where a bit line pair and a sense node pair are coupled by a pair of transistors, and when those transistors are turned on, the bit line pair and the sense node pair share charge.

At action 820, the method includes charge sharing between the first bit line pair and the first sense node pair. In the example of FIG. 7, when the transistors are turned on, the bit line pair is electrically coupled to the sense node pair. In an example in which the transistors are PMOS transistors, the gate to source voltages determine the timing of a particular transistor turning on. For instance, when the magnitude of the gate source voltage reaches a higher voltage more quickly, the transistor will turn on sooner, and when the magnitude of the gate source voltage reaches a higher voltage more slowly, the transistor will turn on later. Thus, a bit line or complementary bit line may charge or discharge a sense node or complementary sense node more quickly or more slowly, depending on the charge sharing architecture. However, the time lag in the charge sharing may result in a voltage that is a fraction of the rail voltage but may be detected to make a bit decision.

At action 830, the method includes inputting values from the sense node pair to logic circuitry. In one example, the logic circuitry may include cross coupled AOI gates, such as in the FIG. 2 implementation. In another example, the logic circuitry may include cross coupled NAND gates, such as in the FIG. 6 implementation.

At action 840, the method includes causing the logic circuitry to make a bit decision based on the values from the first sense node pair. For instance, the logic circuitry may provide a logic function that provides an output of digital one or zero in response to the voltage difference detected between the sense node and complementary sense node.

As noted above, the method may be performed in a memory system that has multiple memory banks, each of the memory banks coupled to a read multiplexer, where each read multiplexer is coupled to a sense node pair. In some examples, only one memory bank may be accessed during a read or write operation. Therefore, a subsequent read operation may be performed on the same memory bank or a different memory bank. The actions 850-870 illustrate a subsequent read operation that is performed on a second memory bank and using a second bit line pair and second sense node pair. However, it is understood that in other examples the actions 850-870 may be performed on a same memory bank using the first bit line pair and second sense node pair.

Figure 8:
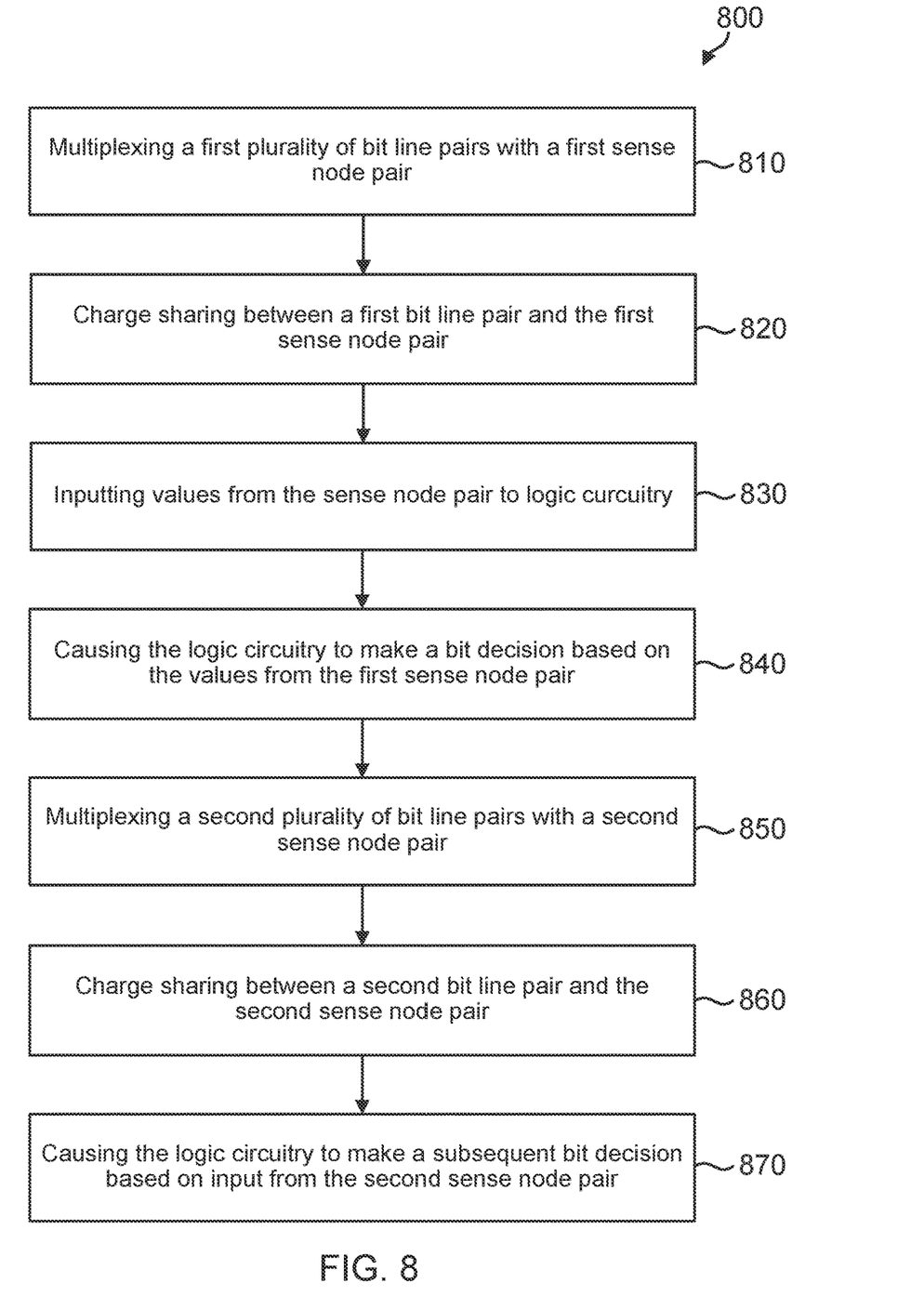
FIG. 8 illustrates a flowchart of an example method that may be performed by the multi-bank memories of FIGS. 1 and 5.

The scope of implementations is not limited to the series of actions described with respect to FIG. 8. Rather, other implementations may add, omit, rearrange, or modify one or more of the actions. For instance, during operation of the memory system, a read operation may be performed on the first memory bank or on the second memory bank and the subsequent read operation may then be performed on either the first memory bank run the second memory bank, and on and on. The read operations may or may not be interspersed with write operations, and the operations may repeat as appropriate.

Figure 9:
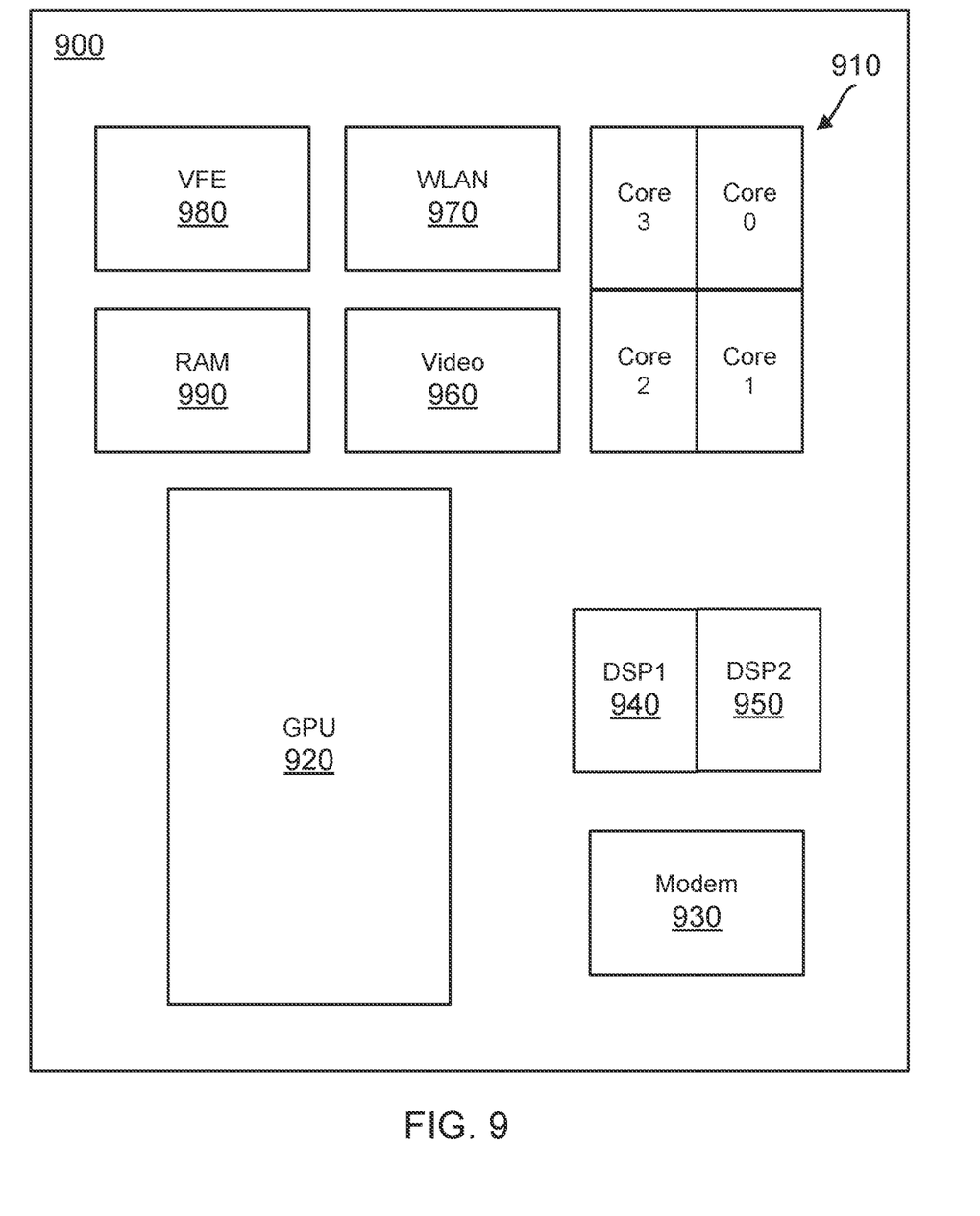
FIG. 9 illustrates an example system on chip (SOC) that may incorporate a memory according to an aspect of the disclosure.

FIG. 9 is an illustration of example SOC 900, according to one implementation. In this example, SOC 900 is implemented on a semiconductor die, and it includes multiple system components 910-990. Specifically, in this example, SOC 900 includes CPU 910 that is a multi-core general-purpose processor having four processor cores, core 0-core 3. Of course, the scope of implementations is not limited to any particular number of cores, as other implementations may include two cores, eight cores, or any other appropriate number of cores in the CPU 910. SOC 900 further includes other system components, such as a first digital signal processor (DSP) 940, a second DSP 950, a modem 930, GPU 920, a video subsystem 960, a wireless local area network (WLAN) transceiver 970, and a video-front-end (VFE) subsystem 980. SOC 900 also includes RAM memory unit 990, which may operate as system RAM for any of the components 910-980. For instance, RAM memory unit 990 may receive data and instructions from any of the components 910-980.

RAM memory unit 990 may include sense amplifier architectures serving multi-bank arrangements, such as those described above with respect to FIGS. 1-7. Furthermore, RAM memory unit 990 may perform the actions of FIG. 8 to perform read operations.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

Implementation examples are described in the following numbered clauses:

1. A circuit comprising:
    a first read multiplexer coupling a first plurality of bit lines to a first sense node and a first complementary sense node;
    a second read multiplexer coupling a second plurality of bit lines to a second sense node and a second complementary sense node; and
    a first sense amplifier coupled to the first sense node and the first complementary sense node, wherein the first read multiplexer is associated with a first bank of memory bit cells, and wherein the second read multiplexer is associated with a second bank of memory bit cells.
2. The circuit of clause 1, further comprising:
    a second sense amplifier coupled to the second sense node and the second complementary sense node, and an output of the second sense amplifier being coupled to an output of the first sense amplifier.

3. The circuit of clause 2, wherein the first sense amplifier includes a first cross coupled pair of NAND gates, and wherein the second sense amplifier includes a second cross coupled pair of NAND gates, the circuit further comprising:
   a first push pull circuit coupled to the first cross coupled pair of NAND gates and a second push pull circuit coupled to the second cross coupled pair of NAND gates,
   wherein the output of the first sense amplifier and the output of the second sense amplifier are coupled through the first push pull circuit and the second push pull circuit.
4. The circuit of clause 3, wherein the first cross coupled pair of NAND gates is coupled to the first sense node, and wherein the second cross coupled pair of NAND gates is coupled to the first complementary sense node.
5. The circuit of clause 1, wherein the first sense amplifier is further coupled to the second sense node and the second complementary sense node.
6. The circuit of clause 5, wherein the first sense amplifier comprises:
   a cross coupled pair of AND-OR-Invert (AOI) gates, wherein:
   a first AOI gate of the cross coupled pair of AOI gates is coupled to the first complementary sense node, the second complementary sense node, and an output from a second AOI gate of the cross coupled pair of AOI gates; and
   the second AOI gate of the cross coupled pair of AOI gates is coupled the first sense node, the second sense node, and an output from the first AOI gate of the cross coupled pair of AOI gates.
7. The circuit of clause 5, wherein the first sense amplifier comprises:
   a cross coupled pair of AND-OR-Invert (AOI) gates; and
   a push pull circuit coupled to an output of a first AOI gate of the cross coupled pair of AOI gates and an output of a second AOI gate of the cross coupled pair of AOI gates.
8. The circuit of clause 5, wherein the first sense amplifier is coupled to N further sense nodes and N further complementary sense nodes, wherein the first sense amplifier further comprises:
   a cross coupled pair of AND-OR-Invert (AOI) gates, wherein:
   a first AOI gate of the cross coupled pair of AOI gates is coupled to the first complementary sense node, the second complementary sense node, and the N further complementary sense nodes; and
   a second AOI gate of the cross coupled pair of AOI gates is coupled the first sense node, the second sense node, and the N further sense nodes, wherein N is an integer greater than one.
9. A method comprising:
   in a first read operation, multiplexing a first plurality of bit line pairs with a first sense node pair, including coupling a first bit line pair of the first plurality of bit line pairs with the first sense node pair;
   charge sharing between the first bit line pair and the first sense node pair;
   inputting values from the first sense node pair to logic circuitry;
   causing the logic circuitry to make a bit decision based on the values from the first sense node pair; and
   in a subsequent read operation, multiplexing a second plurality of bit line pairs with a second sense node pair, including coupling a second bit line pair of a second plurality of bit line pairs to the second sense node pair, wherein the first plurality of bit line pairs is associated with a first bank of memory bit cells, and wherein the second plurality of bit line pairs is associated with a second bank of memory bit cells.
10. The method of clause 9, further comprising:
    charge sharing between the second bit line pair and the second sense node pair; and
    causing the logic circuitry to make a subsequent bit decision based on input from the second sense node pair.
11. The method of clause 10, wherein the logic circuitry comprises a first sense amplifier associated with the first sense node pair and a second sense amplifier associated with the second sense node pair.
12. The method of clause 10, wherein the logic circuitry comprises a sense amplifier coupled to the first sense node pair and to the second sense node pair.
13. The method of clauses 9-10, wherein the logic circuitry includes multiple cross coupled pairs of NAND gates.
14. The method of clauses 9-10, wherein causing the logic circuitry to make a bit decision includes pushing up or pulling down an output of a first cross coupled NAND pair of gates using a first push pull circuit that is coupled to a second push pull circuit associated with an additional cross coupled pair of NAND gates.
15. The method of clauses 9-10, wherein the logic circuitry includes a cross coupled pair of AND-OR-Invert (AOI) gates.
16. A memory device comprising:
    a plurality of memory banks, each one of the memory banks including a plurality of bit line pairs;
    a plurality of sense node pairs, each of the sense node pairs associated with a respective one of the memory banks;
    means for multiplexing the bit line pairs with the sense node pairs;
    means for making bit decisions based on voltages associated with the sense node pairs during a plurality of read operations directed to the plurality of memory banks.
17. The memory device of clause 16, wherein the means for making bit decisions comprises a cross coupled pair of AND-OR-Invert (AOI) gates, the cross coupled pair of AOI gates being coupled to the plurality of sense node pairs.
18. The memory device of clause 17, further comprising a push pull circuit coupled to an output of a first AOI gate of the cross coupled pair of AOI gates and an output of a second AOI gate of the cross coupled pair of AOI gates.
19. The memory device of clause 16, wherein the means for making bit decisions comprises a plurality of cross coupled NAND gate pairs, a first one of the NAND gate pairs being coupled to a first sense node pair, and a second one of the NAND gate pairs being coupled to a second sense node pair.
20. A memory, comprising:
    a first memory bank including a first plurality of bit cells arranged in a first plurality of columns;
    a second memory bank including a second plurality of bit cells arranged in a second plurality of columns;

a first sense node pair coupled to the first plurality of columns by a first read multiplexer;
a second sense node pair coupled to the second plurality of columns by a second read multiplexer; and
a first sense amplifier coupled to the first sense node pair.

21. The memory of clause 20, wherein the first sense amplifier comprises a cross coupled pair of AND-OR-Invert (AOI) gates that is further coupled to the second sense node pair.

22. The memory of clause 21, wherein the first sense amplifier is coupled to N further sense node pairs, wherein:
a first AOI gate of the cross coupled pair of AOI gates is coupled to a first complementary sense node, a second complementary sense node, and N further complementary sense nodes; and
a second AOI gate of the cross coupled pair of AOI gates is coupled a first sense node, a second sense node, and a N further sense nodes, wherein N is an integer.

23. The memory of clause 20, wherein the first sense amplifier comprises a first cross coupled pair of NAND gates, the memory further comprising a second sense amplifier comprising a second cross coupled pair of NAND gates and is coupled to the second sense node pair.

24. The memory of clauses 20-23, wherein the first sense node pair is coupled to the first plurality of columns by a plurality of bit line pairs, wherein the first read multiplexer is configured to turn on a first p-type metal-oxide semiconductor (PMOS) transistor and a second PMOS transistor to couple a first one of the bit line pairs to the first sense node pair.

What is claimed is:

1. A circuit, comprising:
a first read multiplexer coupling a first plurality of bit lines to a first sense node and a first complementary sense node;
a first transistor having a source coupled to ground and a drain coupled to the first sense node;
a second transistor having a source coupled to ground and a drain coupled to the first complementary sense node;
a second read multiplexer coupling a second plurality of bit lines to a second sense node and a second complementary sense node;
a third transistor having a source coupled to ground and a drain coupled to the second sense node;
a fourth transistor having a source coupled to ground and a drain coupled to the second complementary sense node; and
a sense amplifier coupled to the first sense node and the first complementary sense node, wherein the first read multiplexer is associated with a first bank of memory bit cells, and wherein the second read multiplexer is associated with a second bank of memory bit cells, wherein the sense amplifier is further coupled to the second sense node and the second complementary sense node, and wherein the sense amplifier is configured to sense outputs from the first read multiplexer and outputs from the second read multiplexer.

2. The circuit of claim 1, wherein the sense amplifier comprises:
a cross coupled pair of AND-OR-Invert (AOI) gates, wherein:
a first AOI gate of the cross coupled pair of AOI gates is coupled to the first complementary sense node, the second complementary sense node, and an output from a second AOI gate of the cross coupled pair of AOI gates; and
the second AOI gate of the cross coupled pair of AOI gates is coupled the first sense node, the second sense node, and an output from the first AOI gate of the cross coupled pair of AOI gates.

3. The circuit of claim 1, wherein the sense amplifier comprises:
a cross coupled pair of AND-OR-Invert (AOI) gates; and
a push pull circuit coupled to an output of a first AOI gate of the cross coupled pair of AOI gates and an output of a second AOI gate of the cross coupled pair of AOI gates.

4. The circuit of claim 1, wherein the sense amplifier is coupled to N further sense nodes and N further complementary sense nodes, wherein the first sense amplifier further comprises:
a cross coupled pair of AND-OR-Invert (AOI) gates, wherein:
a first AOI gate of the cross coupled pair of AOI gates is coupled to the first complementary sense node, the second complementary sense node, and the N further complementary sense nodes; and
a second AOI gate of the cross coupled pair of AOI gates is coupled the first sense node, the second sense node, and the N further sense nodes, wherein N is an integer greater than one.

5. A method, comprising:
in a first read operation, discharging a first sense node pair followed by multiplexing a first plurality of bit line pairs with the first sense node pair, including coupling a first bit line pair of the first plurality of bit line pairs with the first sense node pair;
charge sharing between the first bit line pair and the first sense node pair;
inputting values from the first sense node pair to logic circuitry;
causing the logic circuitry to make a bit decision based on the values from the first sense node pair; and
in a subsequent read operation, discharging a second sense node pair followed by multiplexing a second plurality of bit line pairs with the second sense node pair, including coupling a second bit line pair of the second plurality of bit line pairs to the second sense node pair, wherein the first plurality of bit line pairs is associated with a first bank of memory bit cells, and wherein the second plurality of bit line pairs is associated with a second bank of memory bit cells, wherein the logic circuitry comprises a sense amplifier coupled to the first sense node pair and to the second sense node pair.

6. The method of claim 5, further comprising:
charge sharing between the second bit line pair and the second sense node pair; and
causing the logic circuitry to make a subsequent bit decision based on input from the second sense node pair.

7. The method of claim 5, wherein the logic circuitry includes a cross coupled pair of AND-OR-Invert (AOI) gates.

8. A memory device comprising:
a plurality of memory banks, each one of the memory banks including a plurality of bit line pairs;
a plurality of sense node pairs, each of the sense node pairs associated with a respective one of the memory banks;

means for discharging the plurality of sense node pairs;
means for multiplexing the bit line pairs with the sense node pairs; and
means for making bit decisions based on voltages associated with the sense node pairs during a plurality of read operations directed to the plurality of memory banks,
wherein the means for making bit decisions comprises a cross coupled pair of AND-OR-Invert (AOI) gates, the cross coupled pair of AOI gates being coupled to the plurality of sense node pairs.

9. The memory device of claim 8, further comprising a push pull circuit coupled to an output of a first AOI gate of the cross coupled pair of AOI gates and an output of a second AOI gate of the cross coupled pair of AOI gates.

10. A memory, comprising:
a first memory bank including a first plurality of bit cells arranged in a first plurality of columns;
a second memory bank including a second plurality of bit cells arranged in a second plurality of columns;
a first sense node pair including a first sense node and a first complement sense node both coupled to the first plurality of columns by a first read multiplexer;
a first transistor having a source coupled to ground and a drain coupled to the first sense node;
a second transistor having a source coupled to ground and a drain coupled to the first complementary sense node;
a second sense node pair coupled to the second plurality of columns by a second read multiplexer; and
a first sense amplifier coupled to the first sense node pair, wherein the first sense amplifier is coupled to N further sense node pairs.

11. The memory of claim 10, wherein the first sense amplifier comprises a cross coupled pair of AND-OR-Invert (AOI) gates that is further coupled to the second sense node pair.

12. The memory of claim 11, wherein:
a first AOI gate of the cross coupled pair of AOI gates is coupled to a first complementary sense node, a second complementary sense node, and N further complementary sense nodes; and
a second AOI gate of the cross coupled pair of AOI gates is coupled a first sense node, a second sense node, and a N further sense nodes, wherein N is an integer greater than one.

13. The memory of claim 10, wherein the first sense node pair is coupled to the first plurality of columns by a plurality of bit line pairs, wherein the first read multiplexer is configured to turn on a first p-type metal-oxide semiconductor (PMOS) transistor and a second PMOS transistor to couple a first one of the bit line pairs to the first sense node pair.

* * * * *